(12) United States Patent
Yang et al.

(10) Patent No.: US 7,863,105 B2
(45) Date of Patent: Jan. 4, 2011

(54) IMAGE SENSOR PACKAGE AND FORMING METHOD OF THE SAME

(75) Inventors: Wen-Kun Yang, Hsin-Chu (TW); Jui-Hsien Chang, Ihudong Township, Hsinchu County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 419 days.

(21) Appl. No.: 12/117,087

(22) Filed: May 8, 2008

(65) Prior Publication Data

US 2008/0206918 A1    Aug. 28, 2008

Related U.S. Application Data

(62) Division of application No. 11/608,266, filed on Dec. 8, 2006, now abandoned.

(51) Int. Cl.
*H01L 21/44* (2006.01)
(52) U.S. Cl. .............................. 438/116; 438/64; 438/66
(58) Field of Classification Search ............ 438/64–67, 438/69, 71, 116, 124, 126, 127; 257/431–434, 257/680
See application file for complete search history.

(56) References Cited

U.S. PATENT DOCUMENTS

| 5,514,888 | A | 5/1996 | Sano et al. ................... 257/232 |
| 7,288,757 | B2 * | 10/2007 | Farnworth et al. ............ 438/64 |
| 7,479,627 | B2 * | 1/2009 | Yoshimoto et al. ............ 438/64 |
| 7,531,443 | B2 * | 5/2009 | Pratt ........................... 438/618 |
| 2005/0151228 | A1 * | 7/2005 | Tanida et al. ................. 257/620 |
| 2006/0001147 | A1 * | 1/2006 | Tomita et al. ................ 257/690 |

\* cited by examiner

*Primary Examiner*—Kevin M Picardat
(74) *Attorney, Agent, or Firm*—Kusner & Jaffe

(57) ABSTRACT

An image sensor package comprises a substrate, a chip mounted over the substrate. A molding material is formed surrounding the chip to expose a micron lens area, wherein the molding material includes via structure passing there through. A protection layer is formed on the micro lens area to prevent the micro lens. A redistributed conductive layer is formed over the molding material to connect to a pad of the chip. Metal pads are formed on via structure as connecting points with PCB. A cover layer is formed over the substrate to isolate the metal pads.

8 Claims, 4 Drawing Sheets

IMAGE SENSOR PACKAGE AND FORMING METHOD OF THE SAME

RELATED APPLICATIONS

This application is a divisional of U.S. application Ser. No. 11/608,266, filed Dec. 8, 2006 now abandoned.

BACKGROUND OF THE INVENTION

1. Field of the Invention

This invention relates to an image sensor package, and more particularly to an image sensor package structure free of particle contamination on micro lens, and the method for manufacturing the same.

2. Description of the Prior Art

The semiconductor technologies are developing very fast, and especially semiconductor dice have a tendency toward miniaturization. However, the requirements for the functions of the semiconductor dice have an opposite tendency to variety. Namely, the semiconductor dice must have more I/O pads into a smaller area, so the density of the pins is raised quickly. It causes the packaging for the semiconductor dice to become more difficult and decrease the yield. The main purpose of the package structure is to protect the dice from outside damages. Furthermore, the heat generated by the dice must be diffused efficiently through the package structure to ensure the operation the dice. Most of the package technologies divide dice on a wafer into respective dice and then to package and test the die respectively. Another package technology, called "Wafer Level Package (WLP)", can package the dice on a wafer before dividing the dice into respective dice. The WLP technology has some advantages, such as a shorter producing cycle time, lower cost, and no need to under-fill or molding.

A digital image technique has been wildly applied to image shooting instrument such as digital camera, image scanner, etc. The conventional CMOS sensor is disposed on a circuit board. The CMOS sensor has a chip secured therein. The lens seat has a focusing lens for focusing the image onto the chip of the CMOS sensor. Through the lens, the image signal is sent by the chip to a digital processor for converting the analog signal into digital signal. The Chip of the CMOS sensor is relatively sensitive to infrared ray and dust particles. If the unwanted particles are not removed from the sensor, it leads to downgrade the quality of the device. In order to achieve the purpose, the removal by manual may damage the sensitive chip. Typically, the image sensor module is formed by using a method of COB or LCC. One drawback of the COB is lower yield rate during packaging process due to particle contamination on sensing area. Besides, the drawbacks of the LCC are higher packaging cost and lower yield rate due to particle contamination on sensing area.

Further, micro lenses are optical components on semiconductors utilized as solid state imaging devices. One of the most important considerations in designing and manufacturing micro lenses is photosensitivity. One reason micro lens photosensitivity may be reduced is that the area of each micro lens has been reduced below an optimum value. Moreover, SHELL CASE company also develops wafer level package technique, the image sensor dice packaged by the SHELL CASE is higher cost due to requiring two glass plate and complicate process. And, the transparency is bad due to epoxy wearing out, and the potential reliability may be reduced. U.S. Pat. No. 5,514,888 for ON-CHIP SCREEN TYPE SOLID STATE IMAGE SENSOR AND MANUFACTURING METHOD THEREOF; issued May 7, 1996 to Yoshikazu Sano, et al. teaches a method for forming charge-coupled devices (CCDS) on a silicon substrate. A micro lens array is formed over the CCD array using conventional lithography and re-flow techniques.

Wire bonding technology is a conventional technique used to make electrical connections within the package. Wire bonding may employ gold, aluminum, or copper wires. A wire is bonded at one end to the chip and at the other end to a next-level substrate such as a lead frame, a printed circuit board, a ceramic substrate, or a flexible circuit board.

A conventional technique of wire bonding is to form a ball bond on the chip and a stitch bond on the substrate. More particularly, a ball is formed on a tail of the wire, which extends from the end of a capillary of a wire bonder, and is bonded to a bond pad of the chip under pressure by the capillary while heat and/or ultrasonic vibration are applied. After the ball bond is formed, a loop is formed in the wire by subsequent action of the capillary. The capillary deforms the wire against a bond position of the substrate, producing a wedge-shaped stitch bond.

Therefore, what is desired is to provide a novel image sensor package structure free of particle contamination on sensing area and improving traditional wire bonding connect.

SUMMARY OF THE INVENTION

Therefore, the present invention has been made in view of the above problems in the prior arts, and it is an objective of the present invention to provide an image sensor package structure without particle contamination on micro lens and method for manufacturing the same. The image sensor package structure according to the present could be employed via through hole as connecting points free of traditional wire bonding.

An image sensor package comprises a substrate, a chip mounted over the substrate. A molding (core paste) material is formed surrounding the chip to expose a micron lens area, wherein the molding material includes via structure passing there through. A protection layer is formed on the micro lens area to prevent the micro lens. A redistributed conductive layer is formed over the molding material to connect to a pad of the chip. Metal pads are formed on via structure. A cover layer is formed over the substrate to isolate the metal pads.

The material of the substrate includes metal, Alloy42 (42% Ni-58% Fe), Kovar (29% Ni-17% Co-54% Fe), glass, ceramic, silicon or PCB (preferably the high Tg epoxy type FR5 or BT type materials). The chip includes CCD, CMOS image sensor die. The materials of the molding material include silicone rubber, resin, epoxy. The materials of the first dielectric layer and the second dielectric layer include SINR, BCB, PI, silicone based. The materials of the protection layer on micro lens include $SiO_2$, $Al_2O_3$, Fluoropolymer. The materials of the redistributed conductive layer include Cu/Au, Cu/Ni/Au alloy. The materials of via include Ti/Cu, or Ti/W/Cu alloy. The materials of the cover layer include epoxy, resin, silicone base.

A method of making an image sensor package, comprises firstly, providing a chip with a protection layer formed on a micro lens area; filling a molding (core paste) material surrounding said chip; next, providing a substrate mounting on the chip; forming a first dielectric layer over the molding material and the chip, the first dielectric layer having a first opening (Al pads) and a second opening exposing a micro lens area formed therein; subsequently, removing partial of the first dielectric layer and the molding material to form a third opening; and then, forming a seed metal layers and a redistributed conductive layer over the first dielectric layer to fill into the first opening to connect pad of the chip; forming a via to fill into the third opening; next, forming a second dielectric layer over the first dielectric layer and the redistributed layer, the second dielectric layer having a fourth opening exposing said micro lens area; forming metal pads on the via; subsequently, forming a cover layer over the substrate.

The first opening and the second opening is formed by employed a lithography process and an etching process. The third opening is formed by employed a lithography process and an etching process. The third opening is formed by employed a laser drilling process. The redistributed conductive layer is formed by employed an electro-plating process. Via metal is formed by employed an electro-plating process. The fourth opening is formed by employed a lithography process and an etching process.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims. Then, the components of the different elements are not shown to scale. Some dimensions of the related components are exaggerated and meaningless portions are not drawn to provide a more clear description and comprehension of the present invention.

Figure 1:
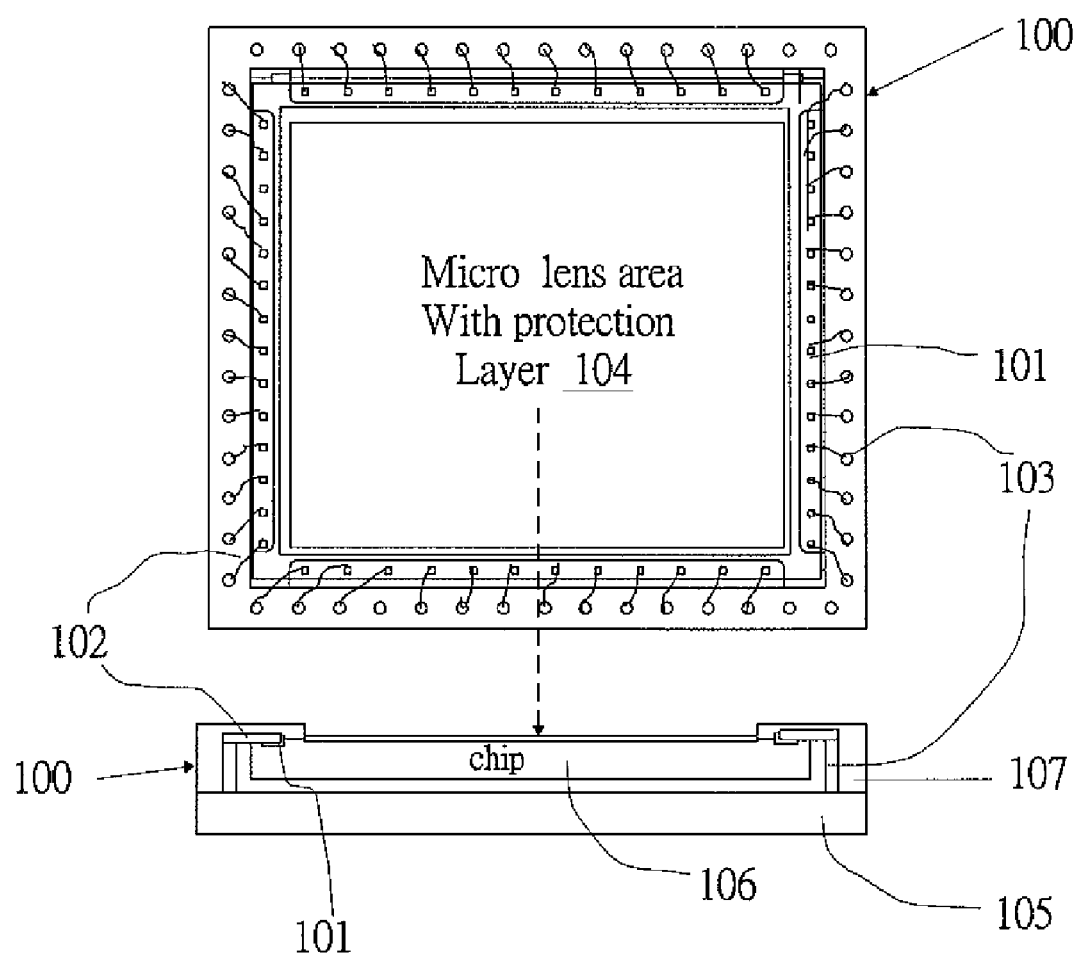
FIG. 1 is a top view and cross-sectional view schematic diagram of an image sensor package structure according to the present invention.

FIG. 1 is a top view and cross-sectional view showing a basic structure as an image sensor package according to the present invention.

Namely, as shown in FIG. 1, the image sensor package 100 according to the present invention is, as the basic structure, structured from a rectangular-shaped substrate 105 made of metal material, a semiconductor device chip 106 (CMOS image sensor die) for image pickup including a two-dimensional C-MOS image sensor or the like which is mounted on the substrate 105 through a molding material (core paste) 107 made of silicone rubber, resin or epoxy, a via structure (through holes) 103 is formed through the core paste and filed with copper (Cu) material that is formed by an electro-plating process. The structure is configured with a cylinder shape or the like and which is connected to the substrate 105 as connecting portion with PCB (Printed Circuit Board) mother board, a seed metal layer (do not shows the drawing) and a redistributed conductive layer 102 are connected to die pads 101 of the semiconductor device chip 106 and the via structure 103, and a protection layer 104 is formed on the image sensor chip 106 to cover a sensing area of the image sensor chip.

Figure 2:
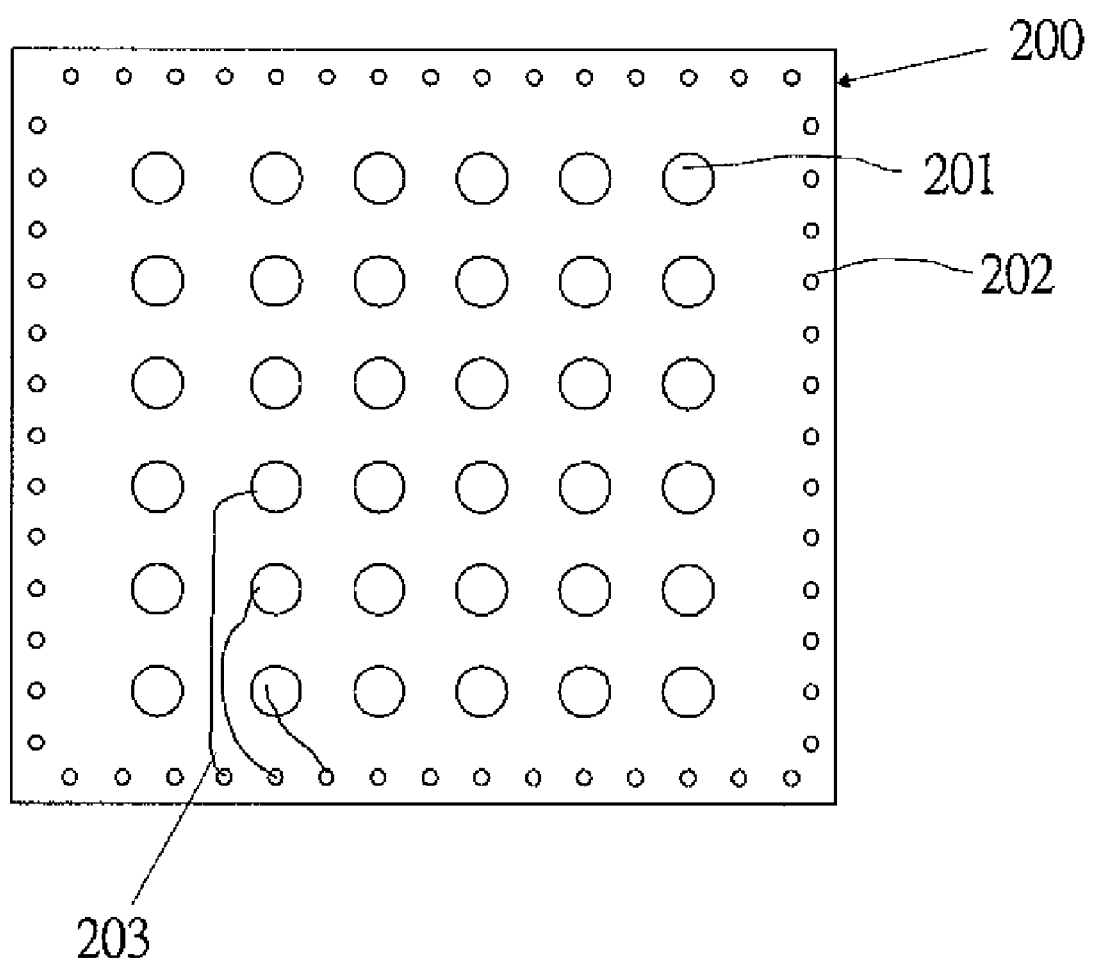
FIG. 2 is a bottom view schematic diagram of an image sensor BGA package structure according to the present invention.
Figure 3:
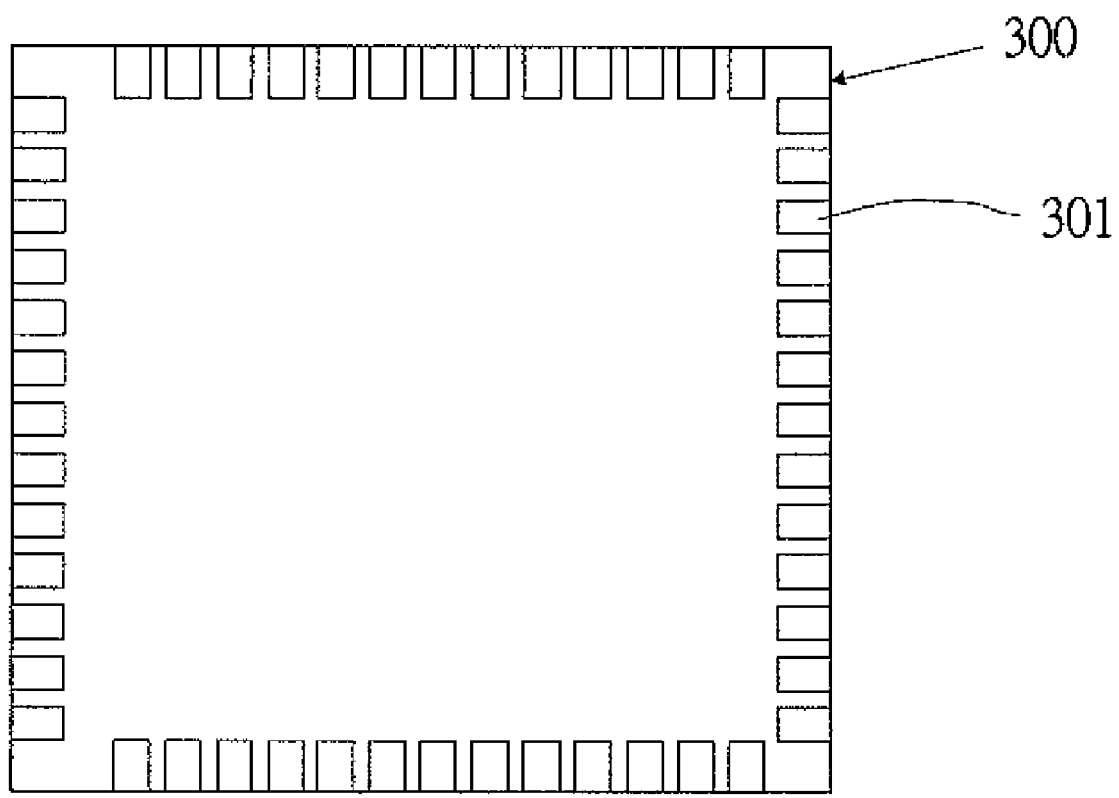
FIG. 3 is a bottom view schematic diagram of an image sensor LGA package structure according to the present invention.

The image sensor package according to the present invention is, for example. Ball Grid Array (BGA) package 200 or Lane Grid Array (LGA) package 300, shown in FIG. 2 and FIG. 3 respectively. Namely, FIG. 2 and FIG. 3 show a bottom view of the Ball Grid Array (BGA) package 200 and LGA package 300 respectively. Ball Grid Array (BGA) package is characterized by the use of a package substrate whose front side is mounted with a semiconductor chip and whose back side is implanted with a grid array of solder balls using a self-alignment technique to solder join with PCB mother board. This allows more input/output (I/O) connections to be accommodated on the same unit area of a chip carrier (i.e. package substrate), so as to meet the requirement for a highly integrated semiconductor chip, such that the entire package can be electrically connected to an external device by means of the solder balls or bumps.

In Ball Grid Array (BGA) package, metal soldering balls 201 are electrically coupled with via 202 through the redistributed conductive layer 203. In LGA package, the metal pads 301 allow the signal electrically coupling with the PCB mother board. The metal pads are as terminal pins with pins pitch about 400 micron, the pin area is about 400 micron×200 micron and the pins count per site is 13, then, the dimension of per side will be 0.4 mm+(13×0.4 mm)+0.4 mm. Thickness of surface metal (Au) of the terminal pins is about or more 2000 angstrom (Å) for better soldering join.

Figure 4:
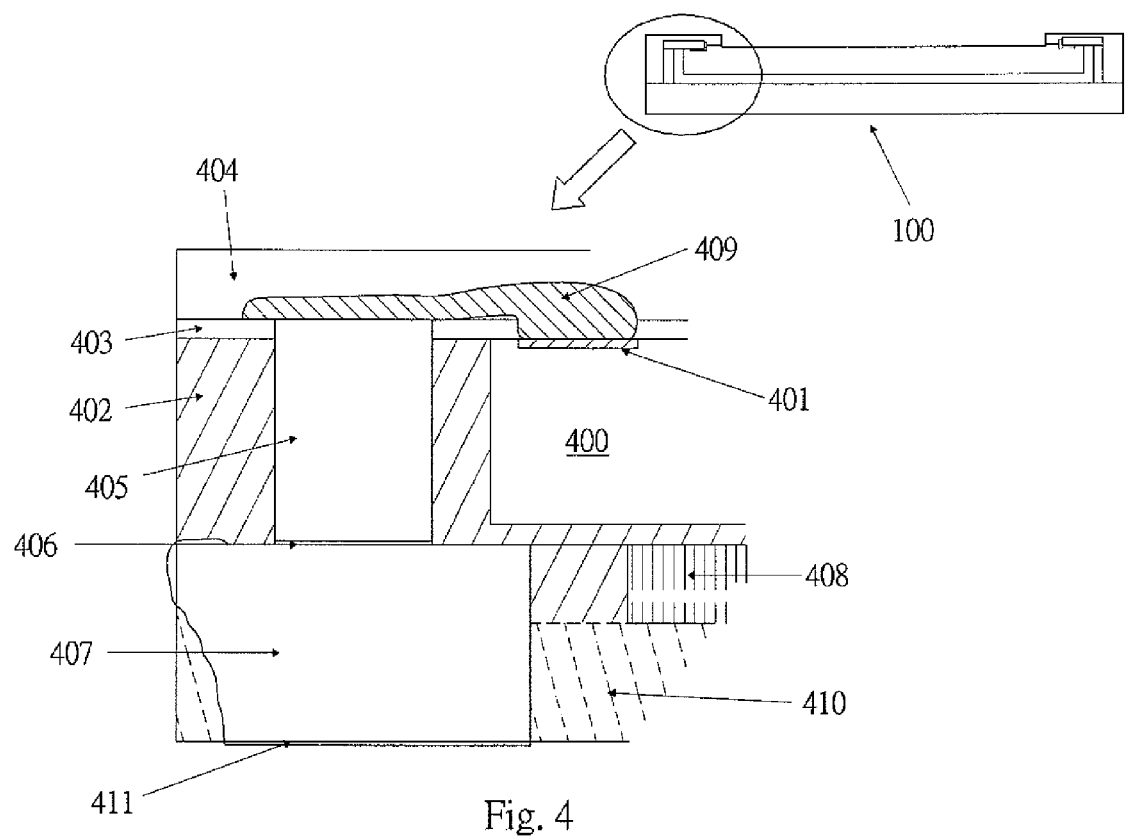
FIG. 4 is a cross-sectional view schematic diagram of an image sensor package structure according to the present invention.

The detailed peripheral structure of the image sensor package 100 illustrates in FIG. 4. It shows an image sensor package structure of the preferred embodiment of the present invention. Specifically, as shown in FIG. 4, the image sensor package 100 is structured from a semiconductor device chip 400 for image pickup including a two-dimensional C-MOS image sensor or the like which is mounted on the substrate 408 through a molding material (core paste) 402 or die attached materials, a seed metal layer and a redistributed conductive layer 409 are connected to die pads 401 of the semiconductor device chip 400, a first dielectric layer 403 covers over the core paste 402 area and the chip 400 except the die pads 401 and the micro lens area. A second dielectric layer 404 covers over the redistributed conductive layer 409 and the first dielectric layer 403 except the micro lens area to protect the chip 400, the via structure (through holes) 405 passing through the first dielectric layer 403 and the core paste 402 which is connected to the metal pads 407 and the redistributed conductive layer 409. The protection layer 104 (shown in FIG. 1) covers on the micro lens formed on the image sensor chip 400, and a cover layer 410 is coated over the substrate 408 and the core paste 402 after formed the metal pads 407.

The substrate 408 is, for example, hard bulk type metal, Alloy42 (42% Ni-58% Fe), Kovar (29% Ni-17% Co-54% Fe), glass, ceramic, silicon, PCB organic (high Tg epoxy type FR5 or BT type) substrate. The above semiconductor chip 400 is adhered to and loaded on the top surface thereof. The composition of the Alloy42 comprises 42% Ni and 58% Fe, and the composition of the Kovar comprises 29% Ni, 17% Co and 54% Fe. In this case, the substrate 408 is a plate-shaped structure having a round or a rectangular shape. Raw material of the metal pads 407 comprises copper (Cu), Alloy42. The metal pads 407 could be employed as connecting portion with PCB (Printed Circuit Board). A thin metal film 406, which is made of aurum (Au), may be an interface between via 405 and the metal pads 407 as an adhesion layer and a seeding layer. Another thin metal film 411, which is made of aurum (Au), is formed on soldering side of the metal pads 407 to improve the electricity of the package.

According to the present invention, it is advantage that the package is employed via 405 and the metal pads 407 free of wire bonding of the traditional package to connect PCB or external device.

The main properties of the Alloy42 comprises coefficient of thermal expansion (CTE) about 4.0~4.7 (ppm/° C.), thermal conductivity about 12 (W/m-° C.), electrical resistivity about 70 (μΩ-cm) and Yield bend fatigue strength about 620 (MPa). Similarly, the main properties of the Kovar comprises CTE about 5.1~8.7 (ppm/° C.), thermal conductivity about 40 (W/m-° C.) and electrical resistivity about 49 (μΩ-cm). In other words, the metal alloy of the present invention may be employed as a lead/lead frame alloys. Special alloys like Alloy42 or Kovar have gained wide acceptance because of their thermal expansion coefficients, which closely match those of silicon wafer and ceramics, and their high formability. Alloy42 and Kovar are one of the aspects to the present invention. As above-mentioned, the coefficients of thermal expansion of both these materials match well with those of silicon which are 2.3 ppm/° C., and that of ceramics substrate (3.4 to 7.4 ppm/° C.). Kovar and Alloy42 also have high fatigue strength. Alloy42 has a fatigue strength of 620 MPa compared with only 380-550 MPa for most cooper alloys. These materials are good candidates for electrically conduction to serve as the electrical path for the signals. Moreover, the material should be resistant to corrosion, which increases the electrical resistance of the leads, causing electrical failure and can eventually result in mechanical fracture. The lead materials in the present invention may comprise Fe—Ni alloy, Fe—Ni—Co alloy, Cu—Fe alloy, Cu—Cr alloy, Cu—Ni—Si alloy or Cu—Sn alloy etc.

Here, it is assumed that, there is provided at the semiconductor device chip 400 for image pickup, for example, a semiconductor circuit section or the like, in which a photo-electric converting section (sensor section) formed from a group of photoelectric converting elements forming the two-dimensional C-MOS image sensor and arrayed two-dimensionally; a driving circuit section for driving the group of photoelectric converting elements successively and obtaining signal electric charges; an analog-to-digital converting section for converting the signal electric charges to a digital signal; a signal processing section for making the digital signal an image signal output; and exposure controlling means for electrically controlling the exposing time on the basis of an output level of the digital signal are formed on the same semiconductor chip.

The manufacturing method of the image sensor package according to the present invention is detailed description as followings. In an image sensor wafer, a first step is performed to clean a semiconductor wafer with a plurality of chips 400. Next, the protection layer 104 (shown in FIG. 1) is coated on the micro lens formed on the image sensor chip 400. Raw material of the protection layer comprises $SiO_2$, $Al_2O_3$ or Fluoropolymer. And then, the protection layer is cured. Subsequently, a top cover layer is temporary to cover the protection layer during the process. The semiconductor wafer is executed by a step of back lapping of the semiconductor wafer. The thickness of the chip 400 is about 175 micron or 127 micron (5 mils), it depends on the thickness of total package. Subsequently, the resultant semiconductor wafer is singulated to separate the chips 400.

For s substrate 408, a photo-resist layer is coated on the surface 1 (front side) of the substrate 408, and then the substrate is performed to a lithography process to open the un-etching area, then, forming by aurum (Au) materials by an electro-plating process. Subsequently, it is performed to strip the photo-resist layer and a half wet-etching process to form pads, for example LGA pads 301 shown in FIG. 3. Raw material of the substrate is selected from the group consisting of metal, Alloy42, Kovar, glass, ceramic, silicon and PCB. Optionally, a step is performed to clean the surface 1 of the substrate 408.

Next, the chips 400 with pads side are active surface side adhered to the temporary base (tool with chip re-distribution alignment pattern) through an elastic material by using a pick and place with fine alignment system. The pick and place system can be regarded as a modified movable flip chip bonder. In this case, the pluralities of chip 400 could be stripped from the elastic material by a special or predetermined environment. In other words, surface of the elastic material has viscosity (adhesion) in common state, and it lose viscosity when the elastic material is placed in a special environment to. The special or predetermined environment may be the solution of DI water, special solvent, predetermined temperature around 20-40 centigrade degree depending on the solution, or specific light (such as UV light) etc. The engagement of the temporary base (tool) can be reused through cleaning.

A filling step is performed to fill a molding material (core paste) 402 into between adjacent the chips 400 and over the chips 400. For example, the core paste 402 is made of a molding material or elastic material. Raw material of the core paste is selected from the group consisting of silicone rubber, resin and epoxy. The width of the core paste 402 is about 500 micron (um) to 1 mm per site, and the scribe line is about 100 to 150 micron. The substrate 408 is mounted on the chips 400 through the core paste 402. A step of UV curing or heat curing package is performed after mounting to enhance mounting effect (adhesion). Next, a step of package stripping from the elastic material by above-mentioned special or predetermined environment after curing is performed.

Subsequently, a first dielectric layer 403 is coated over the core paste 402 and the chip 400, after the surface of chips to be cleaned. The first dielectric layer 403 is performed by a lithography process and an etching process to form first openings exposing aluminum (Al) pads 401 and second openings exposing the micro lens area. Next, another lithography process and etching process are performed to form holes through the first dielectric 403 and the core paste 405. Alternatively, a laser drilling process may be employed to form the through holes. The diameter of via through holes is about 100 micron, and the height of via through holes is about 200 micron (or 150 um), i.e. aspect ratio equal to 2 (or 1.5). A step of RIE cleaning aluminum (Al) pads 401 to prevent from particles contamination is then performed after the laser drilling. A seed metal layer 406 is sputtered into the through holes, aluminum (Al) pads 401 and over the first dielectric layer 403. Next, a photo-resist layer is coated on the seed layer and the first dielectric layer 403. Subsequently, a lithography process is executed to form a photo-resist pattern to expose the die pads 401 and the through holes and RDL pattern. Next, an electro-plating process is performed to fill into the holes and over the die pads 401, and thereby forming via (through holes) 405 and redistributed conductive layer 409. For example, material of the seed metal layer 406 comprises Cu, Ti/Cu alloy, Ti/W/Cu alloy, and material of the redistributed conductive layer 409 comprises Cu/Au alloy, Cu/Ni/Au alloy. Thickness of the redistributed conductive layer 409 is about 6.0 micron. And, the photo-resist is then stripped. Subsequently, seed metal layer is performed by a wet etching to remove the seed metal layer over the first dielectric 403 to form the redistribution conductive layer 409.

Next, a second dielectric layer 404 is coated over a first dielectric layer 403 and the redistributed conductive layer 409 to protect the chip 400. The second dielectric layer 404 is performed by a lithography process and an etching process to form openings exposing the micro lens area. The second dielectric layer 404 is then cured.

The material of the first dielectric layer 403 and the second dielectric layer 404 are selected the group from the consisting of SINR (Siloxane polymer), BCB, PI and silicone based.

The surface 2 (back side) of the substrate 408 is then cleaned. A photo-resist layer is coated on the surface 2 of the substrate 408, and then the substrate is performed to a lithography process and a half etching process except pads such that the metal pads 407 are isolated from each other. In other words, the substrate 408 is performed by twice half etching to isolate the metal (LGA) pads, one in the surface 1 and the others in opposite surface 2. Remaining photo-resist is then stripped. Alternatively, in non-metal substrate 408, another electro-plating metal process may be performed to form the metal pads 407 to connect via 405. The metal pads 407 could be as connecting points with PCB (Printed Circuit Board). Another thin metal film 411, which is made of aurum (Au), is formed on the metal pads 407 to improve the electricity of the package.

Next, the surface 2 (back side) of the substrate 408 is then cleaned. Finally, a cover material 410 is printed on the surface 2 of the substrate 408 and the core paste 402 (near the metal pads 407 area) except the metal pads 407. The cover materials 410 comprise epoxy, resin, silicone rubber. The metal pads 407 could be employed by some process, for example wet etching or back lapping to expose after printing the covering material 407. The cover materials 410 may isolate the metal pads 407 from each other. Then, it is performed to remove the top temporary cover layer of protection layer on micro lens area. Subsequently, the package is singulated to separate from panel.

Moreover, according to the present invention, it is possible to dispose a micro lens for making an aperture large and increasing the efficiency of the incident light, on a surface of a light receiving portion of the semiconductor device chip for image pickup.

The advantage of the present invention comprises the followings: module PCB layout easy, particle free due to protection layer, simple SMT process for LGA type terminal pins, super thin package (less than 400 micron), small foot print (form factor), lower cost due to wafer level package, allowable for large panel size process, highest yield of packaging and module, module assemble fully automatic, and wafer level final testing capability.

Although specific embodiments have been illustrated and described, it will be obvious to those skilled in the art that various modifications may be made without departing from what is intended to be limited solely by the appended claims.

Having described the invention, the following is claimed:

1. A method of making an image sensor package, comprising:
   providing a chip with a protection layer formed on a micro lens;
   filling a molding material surrounding said chip;
   providing a substrate mounting on said chip;
   forming a first dielectric layer over said molding material and said chip, said first dielectric layer having a first opening and a second opening exposing a micro lens area formed therein;
   removing part of said first dielectric layer and said molding material to form a third opening;
   forming a redistributed conductive layer over said first dielectric layer to fill into said first opening to connect pad of said chip;
   forming a via structure to fill into said third opening;
   forming a second dielectric layer over said first dielectric layer and said redistributed conductive layer, said second dielectric layer having a fourth opening exposing said micro lens area;
   forming metal pads on said via structure;
   forming a cover layer over said substrate.

2. The method claim 1, wherein said first opening and said second opening is formed by employing a lithography process and an etching process.

3. The method claim 1, wherein said third opening is formed by employing a lithography process and an etching process.

4. The method claim 1, wherein said third opening is formed by employing a laser drilling process.

5. The method claim 1, wherein said redistributed conductive layer is formed by employing an electro-plating process.

6. The method claim 1, wherein said via structure is formed by employing an electro-plating process.

7. The method claim 1, wherein said fourth opening is formed by employing a lithography process and an etching process.

8. The method claim 1, further comprising a step of performing a half etching process of said substrate.

* * * * *